United States Patent [19]

Young et al.

[11] Patent Number: 4,954,752
[45] Date of Patent: Sep. 4, 1990

[54] ROW DRIVER FOR EL PANELS AND THE LIKE WITH TRANSFORMER COUPLING

[75] Inventors: Edward L. Young, Shelton; Mohan L. Kapoor, Orange, both of Conn.

[73] Assignee: United Technologies Corporation, Hartford, Conn.

[21] Appl. No.: 282,147

[22] Filed: Dec. 9, 1988

[51] Int. Cl.$^5$ .............................................. G09G 3/30
[52] U.S. Cl. ................................ 315/169.3; 315/169.1; 340/781
[58] Field of Search ................... 315/169.3, 161.1, 177; 340/781

[56] References Cited

U.S. PATENT DOCUMENTS

| | | | |
|---|---|---|---|
| 4,225,807 | 9/1980 | Ise et al. | 315/169.3 |
| 4,254,362 | 3/1981 | Tulleners | 315/169.3 X |
| 4,319,164 | 3/1982 | Tulleners | 315/169.3 X |
| 4,595,861 | 6/1986 | Simopoulos et al. | 315/169.3 |
| 4,611,150 | 9/1986 | Ball et al. | 315/169.3 X |
| 4,633,141 | 12/1986 | Weber | 315/169.3 X |
| 4,707,692 | 11/1987 | Higgins et al. | 315/169.3 X |

Primary Examiner—Eugene R. Laroche
Assistant Examiner—Do H. Yoo

[57] ABSTRACT

A simplified row driver switching circuit for display panels and the like, including particularly electroluminescent (EL) panels, as well as plasma panels, using transformer coupling between the power supply and the row electrodes. The circuit limits energy transfer to each row electrode of the EL panel to minimize the effects of destructive arcing caused by inter-electrode shorts. The circuit is energy conservative and eliminates the need for, for example, −160V and +220V power supplies, and provides reduced stress levels for many components through transformer coupling, and all active switches are driven from ground potential. Two row driver circuits are disclosed (FIGS. 4 & 6), the latter, using a split primary coil and double sets of paired switches, allows the row electrodes to be driven to negative, as well as positive, voltages. The primary and secondary windings on the transformer ($T_1$ of FIGS. 4 & 6) are used to store and transfer energy to the essentially capacitive row electrode load ($C_{panel}$) and then back to the power source ($V_{in}$), as various associated switches are pulsed "on" and released. The same power supply can be used for both the row driver and the column driver (FIG. 8).

16 Claims, 7 Drawing Sheets

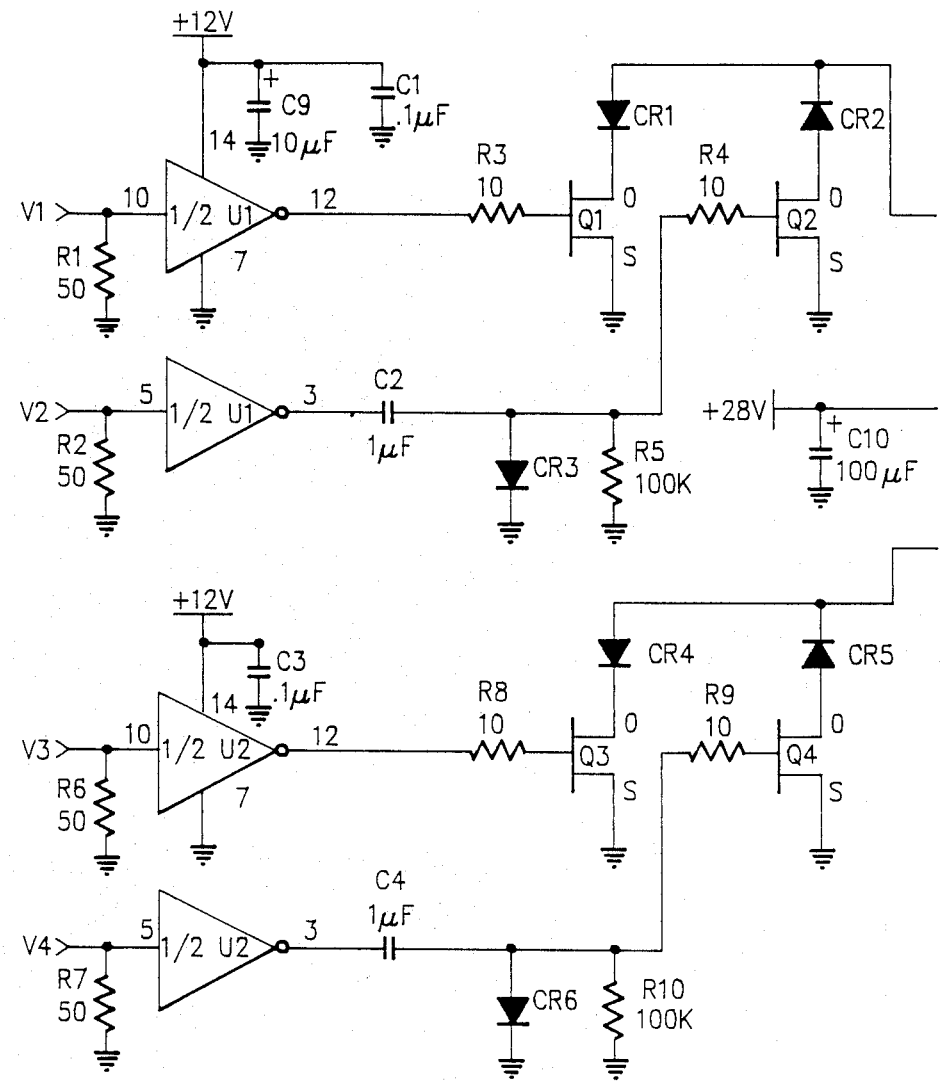
FIG.7.1

ROW DRIVER FOR EL PANELS AND THE LIKE WITH TRANSFORMER COUPLING

REFERENCE TO RELATED APPLICATION

This application relates to some of the same subject matter as co-pending application Ser. No. 282,787, filed concurrently herewith, entitled "Row Driver for Electroluminscent Panels And the Like With Inductor Coupling" by the same inventors hereof, the disclosure of which is incorporated herein by reference.

TECHNICAL FIELD

This invention relates to electrical panels used for, for example, displays of information, including particularly electroluminescent (EL) panels, as well as, for further example, plasma panels, and more particularly to a row driver therefor. Even more particularly, the present invention relates to the use of transformer coupling in such circuits.

BACKGROUND ART

An electrically driven panel, such as an electroluminescent (EL) panel, is used to display indicia in response to appropriate electrical signals imposed upon its electrodes.

The typical electrical model of an electroluminescent (EL) display panel includes horizontal (row) and vertical (column) electrodes of finite resistance with an inter-electrode capacitance evenly distributed along the length of each electrode, with such a model being illustrated in FIG. 1. A row driver working through row switches appropriately drives the row electrodes. A column driver (not illustrated) drives the column electrodes through a bank of column switches. Separate power supplies (not illustrated) typically are provided to separately power the row and column drivers.

The row driver for such an EL panel has two separate modes of operation. In the write mode, each row typically is pulsed sequentially down to −160 V (volts), while the column voltages determine the pixel intensities along the row being addressed. In the refresh mode, all rows are typically simultaneously pulsed up to +220 V, while the columns are all maintained at zero volts. A typical, prior art row drive wave form is graphically illustrated in FIG. 2, showing the relative voltage levels which occur in the row driver through each cycle.

The column electrodes have a relatively high resistance, since they are generally made of a thin-film transparent material. For this reason each column driver sees a load equivalent to a delay line. Each row electrode, however, has a low resistance, and for all practical purposes the row driver sees a purely capacitive load. This type of load enables the use of the resonant row drive scheme of the present invention.

It is noted that some EL panels do not exhibit purely capacitive loads or characteristics, but even these types of panels effectively could be made into a purely capacitive load by adding external capacitance to the panel. Such a panel, so modified or supplemented, would then present an essentially capacitive load, then allowing the use of the resonant row drive scheme of the present invention.

FIG. 3 schematically shows a typical row driver circuit of the prior art. Initially all switches are "off" except switch $S_1$. In order to produce a −160 V write pulse on the EL panel's row electrodes, schematically illustrated in the circuit as the capacitive load $C_{panel}$, switch $S_4$ is turned "on," coupling the panel $C_{panel}$ to −160 V through switch $S_1$, diode $D_3$, and switch $S_4$.

If switch $S_4$ is released and switches $S_5$ and $S_6$ are activated, the capacitative row panel load $C_{panel}$ switches back to zero volts. Now, with switch $S_1$ "off" and $S_2$ activated, the bottom or negative side of the capacitor $C_1$ is raised to +60 V, while the top (positive side) of capacitor $C_1$ is raised to +220 V, since capacitor $C_1$ already had a charge of +160 V across it. A +220 V refresh pulse can now be generated at the panel load $C_{panel}$ by switching switch $S_3$ "on." When the switch $S_3$ is released and switches $S_5$ and $S_6$ are activated, the panel load $C_{panel}$ again will return to zero volts.

The foregoing describes the typical prior art row driver system for EL panels, and such a circuit has significant disadvantages. It requires dual regulated, relatively high voltage supplies (−160 V & +60 V) to drive the EL panel's row electrode load $C_{panel}$. Also, such a prior art drive scheme is not energy efficient.

Additionally, in the prior art design an electrode short on the panel could destroy expensive driver integrated circuits (ICs) and cause the electrode to burn out on the panel itself.

DISCLOSURE OF INVENTION

The row driver circuit of the present invention has significant advantages over the previous design.

As noted, the previous linear row drive scheme of FIG. 3 requires dual regulated, relatively high voltage supplies to drive the EL panel $C_{panel}$. The new driver circuit, as described in detail with respect to, for example, either FIGS. 4 or 6, requires only one power source, which can be unregulated, if so desired. In fact, the row driver of the invention can use the same +60 V power source typically required in the EL column driver circuit.

In the present invention electrical energy from the power supply is stored in a transformer and then transferred to the row electrode. The transformer then is re-energized and dumps the energy back to the power supply. This makes the driver more energy efficient. Thus, the invention's driver circuit is power conservative, since almost all of the energy transferred to the panel's row electrode load $C_{panel}$ is eventually returned to the power source.

One of the most significant advantage of the drive concept of the present invention is that it limits damage due to inter-electrode shorts on the EL panel, by limiting energy transfer to each row.

In the previous, prior art design, as noted above, an electrode short on the panel could destroy expensive driver integrated circuits (ICs) or semiconductor components and cause the electrode on the panel itself to burn out. In the prior art design, since the row electrodes of the panel are connected directly through switch $S_1$, diode $D_3$ & switch $S_4$ during the "write" pulse, the load $C_{panel}$ is connected directly to the −160 V power supply, which is capable of destructive current levels.

In contrast, in the design of the invention, the row electrodes of the panel are connected to the power supply only through the transformer coupling, and therefore can receive only a limited amount of energy during each "write" pulse. As pulses are applied to the transformer drive switch ($S_1$ below), the energy stored in the transformer ($T_1$ below) is limited by the "on" time of the drive switch. The row load therefore will never "see" any energy in excess of that amount. By the invention's limiting the energy transfer to the row, IC component stresses are reduced to non-destructive levels, and a short on the EL panel will not have sufficient energy to destroy the electrode and require panel and/or integrated circuit or semiconductor component replacement.

Additionally, the row drive circuit of the invention incorporates significant improvements even over the row driver circuitry of the co-pending patent application entitled "Row Driver for EL Panels and the Like With Inductor Coupling" (N-1164) identified above, in that all of the active switching elements are driven from ground potential, eliminating the need for floating switch drives. Also, the voltage stress levels on many components are reduced through transformer coupling.

The circuit concepts, described herein in connection with FIGS. 4 & 6 and an EL panel, may be applied to other like panels, including alternating current (AC), thin film plasma panels. However, the invention is particularly applicable to electroluminescent drive schemes.

The foregoing and other features and advantages of the present invention will become more apparent from the following further description and drawings.

BEST MODES FOR CARRYING OUT THE INVENTION

Figure 1:
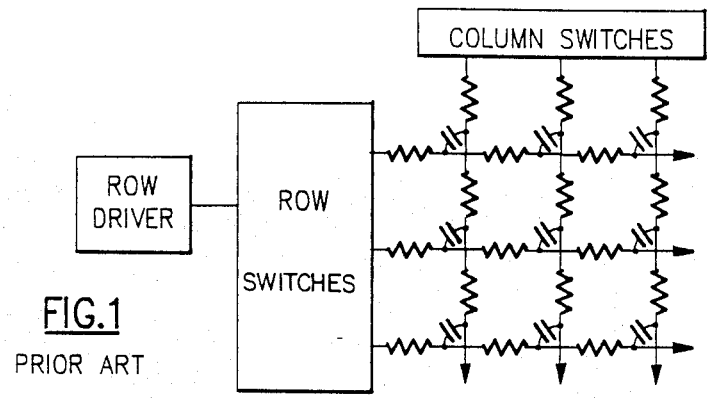
FIG. 1 is a generalized schematic of an electrical model of an exemplary, standard, electroluminescent panel, including its horizontal and vertical electrodes of finite resistance with an inter-electrode capacitance evenly distributed along the length of each electrode, of the prior art, with which EL panel the row driver circuit of the present invention can be used.
Figure 2:
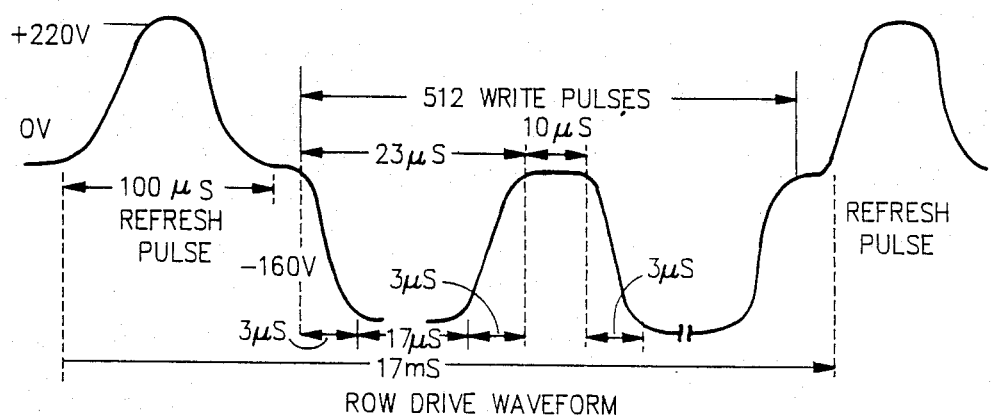
FIG. 2 is a graphical illustration of an exemplary row driver wave form of the prior art showing the varying positive and negative voltage levels of the prior art row driver during each cycle.
Figure 3:
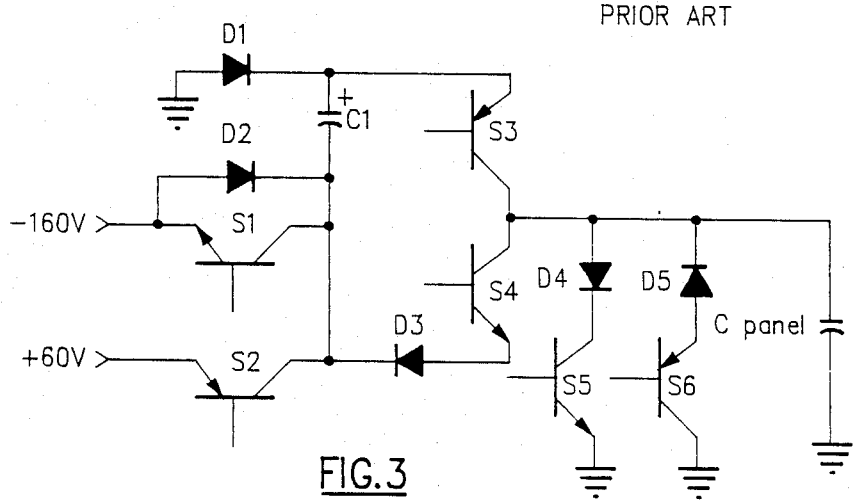
FIG. 3 is a schematic diagram of an exemplary row driver circuit of the prior art for the model of FIG. 1 producing the wave form of FIG. 2.
Figure 4:
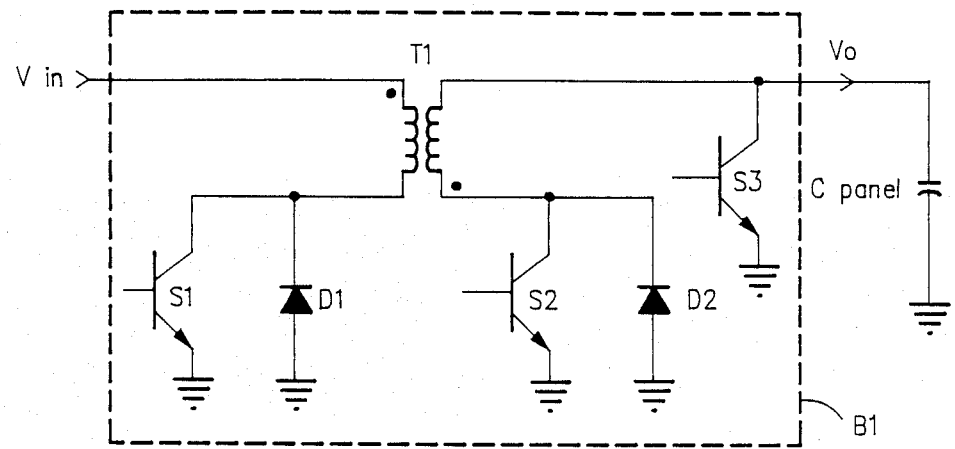
FIG. 4 is a schematic diagram of a first exemplary embodiment of the row driver circuit of the present invention.

With reference to the inventive circuit of FIG. 4, assuming initially that the voltage across the EL panel's essentially capacitive row electrode load $C_{panel}$ is zero volts and that all of the transistor switches (S1–S3) are "off," if transistor switch $S_1$ is pulsed "on," current will ramp up through the primary coil of transformer $T_1$ to a stored energy level of:

$$\tfrac{1}{2} L_p I_p^2 = \tfrac{1}{2} L_p(V_{in} \Delta t/L_p)^2 = V_{in}^2 \Delta t^2/2L_p$$

where
$I_p$ is the final primary coil current,
$L_p$ is the primary coil inductance, and
$\Delta t$ is the "on" time of switch $S_1$.

Figure 5:
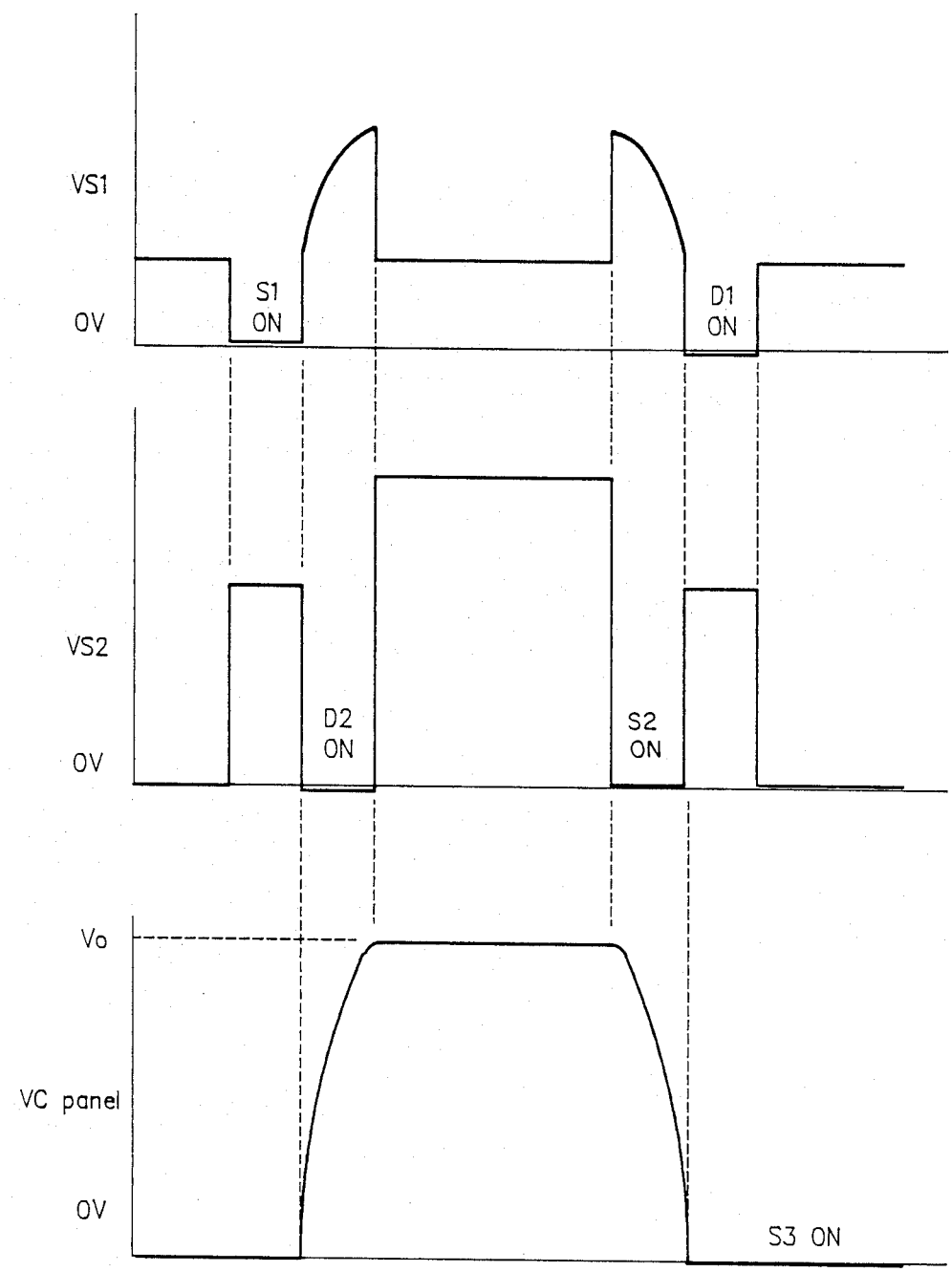
FIG. 5 is a graphical illustration concurrently showing the respective voltage levels across the switches $S_1$, $S_2$ and the panel load $C_{panel}$, which occur in the row driver circuit of FIG. 4 of the present invention.

As switch $S_1$ is released, the secondary coil of transformer $T_1$ flies back and catches on diode $D_2$, and the voltage across the panel's row electrode load $C_{panel}$ rings up with the secondary coil inductance $L_s$ to a final voltage $V_o$, as shown by the row driver wave form in FIG. 5.

By these means only the amount of energy needed to charge up the capacitive row electrode is actually transferred to the panel row. This limited amount of energy is not sufficient to damage the row electrode and the panel, even if a short circuit condition exits in the panel.

The final energy stored in the panel's capacitive row electrode load $C_{panel}$, ignoring the negligible energy losses in the switching components, is equal to the energy that was stored in the primary coil, namely:

$$\tfrac{1}{2} C_{panel} V_o^2 = V_{in}^2 \Delta t^2/2L_p$$

The final voltage $V_o$ is therefore given by:

$$V_o = V_{in} \Delta t / \sqrt{(L_p C_{panel})}$$

Now, if switch $S_2$ is pulsed "on," the voltage across the panel load $C_{panel}$ rings down, resonating with the secondary coil inductance towards zero volts. As switch $S_2$ is released, the energy stored in the transformer causes the primary coil to fly back and catch on diode $D_1$. The stored energy is finally dumped back into the power source $V_{in}$. This dumping back of the stored energy substantially improves the row driver's energy efficiency.

To insure that the final voltage across the panel $C_{panel}$ is zero volts, switch $S_3$ is turned "on."

The situation becomes much more complex, if one wishes to switch the load, namely the essentially capacitive panel row load $C_{panel}$, down to negative voltages as well. In the circuit of FIG. 4, diode $D_2$ prevents $V_o$ from going negative because of the transformer winding. Furthermore, switches $S_2$ and $S_3$ would have to withstand bi-directional voltage swings.

Figure 6:
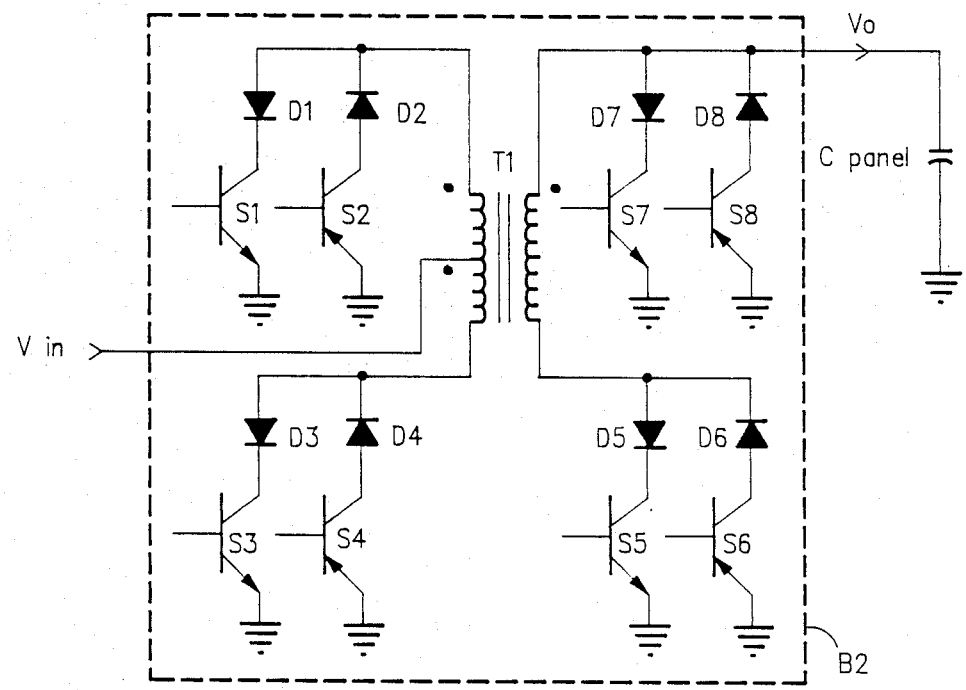
FIG. 6 is a schematic diagram of an alternate, exemplary embodiment of the row driver circuit of the present invention, which alternate circuit is used to switch the EL panel to negative voltages, as well as positive voltages.

Such a bi-direction, positive & negative voltage system is achieved in the alternate circuit of FIG. 6.

With reference to the circuit of FIG. 6, each switch (S1 through S8) is paired with a diode (D1 through D8), respectively, in such a way that, when a particular switch is "off," the corresponding switch-diode pair can withstand a bi-directional voltage swing. Thus, as can be seen in the schematic, the diodes (for example D1 & D2) for their respective, adjacent, related switches (for example S₁ & S₂, respectively) are oppositely directed in their polarity with respect to the switches.

Assuming initially that the voltage on the panel row load $C_{panel}$ is zero volts and that all switches except switch $S_6$ are "off," to charge the panel's capacitive row load $C_{panel}$ to a positive voltage, a short pulse is applied to switch $S_1$, and energy is stored in the top leg of the primary coil of transformer $T_1$. As switch $S_1$ is released, the secondary coil winding flies back and catches on diode $D_6$ (since $S_6$ is "on"), and the stored energy is transferred to the panel row load $C_{panel}$.

By these means only the amount of energy needed to charge up the capacitive row electrode is actually transferred to the panel row. This limited amount of energy is not sufficient to damage the row electrode and the panel, even if a short circuit condition exits in the panel.

Similarly to the circuit of FIG. 4, the transferred energy yields a final voltage $V_o$, as follows:

$$V_o = (V_{in} \Delta t)/\sqrt{(L_p C_{panel})}$$

where $\Delta t$ is the "on" time of switch $S_3$.

To discharge the panel $C_{panel}$ back to zero volts, switch $S_5$ is pulsed "on" and the voltage across the panel $C_{panel}$ rings or resonates back down towards ground, as described above, with respect to the circuit of FIG. 4. If switch $S_2$, is turned "on," then, as switch $S_5$ is released, the top leg of the transformer primary coil flies back and catches on diode $D_2$, dumping its stored energy back into the power source $V_{in}$. This dumping back of the stored energy substantially improves the row driver's energy efficiency.

To insure that the final voltage across the panel row load $C_{panel}$ is at zero volts, both switches $S_7$ and $S_8$ are turned "on," and thus, like switch $S_3$ of the circuit of FIG. 4, they serve as residual energy dump switch means.

Now, if one wishes to switch the panel row load $C_{panel}$ to a negative voltage, this can be accomplished by using the bottom leg of the transformer primary coil, in effect reversing the polarity of the primary coil winding.

Assuming initially that the voltage on the panel row load $C_{panel}$ is zero volts and that all switches except switch $S_5$ are "off," a short pulse is applied to switch $S_3$, and energy is stored in the bottom leg of the primary coil of transformer $T_1$. As switch $S_3$ is released, the secondary coil winding flies back and catches on diode $D_5$ (since switch $S_5$ is now "on"). In this case, the voltage across the panel load $C_{panel}$ will ring down, resonating with the secondary coil inductance $L_s$ to a final negative voltage. Similarly to the circuit of FIG. 4, the transferred energy yields a final voltage $V_o$, as follows:

$$V_o = -(V_{in} \Delta t)/\sqrt{(L_p C_{panel})}$$

where $\Delta t$ is the "on" time of switch $S_3$.

To return the output voltage $V_o$ back to zero, switch $S_6$ is pulsed "on," and the panel $C_{panel}$ will ring, i.e. resonate, with the secondary coil inductance up to ground. If switch $S_4$ is turned "on," then as switch $S_6$ is released, the primary coil winding will fly back and catch on diode $D_4$, dumping the energy back into the power source $V_{in}$.

The circuit shown in FIG. 6 thus provides all of the switching elements required to drive the load $C_{panel}$ to both positive and negative voltages.

It should be noted that the only critical timing wave forms required in the circuit of FIG. 6 are for switches $S_1$ and $S_3$, which control the peak positive and negative voltages applied across the row electrode load $C_{panel}$.

These peak voltages can be regulated using conventional pulse width modulator techniques. For example, a sample hold could be used to monitor the row pulse voltages and feed them back to a pulse width controller, which would adjust the critical pulse widths applied to the switches $S_1$ & $S_3$, thereby maintaining output regulation. This allows the use of an unregulated power source $V_{in}$ with the addition of feed forward control to the pulse width modulator.

Figure 7:
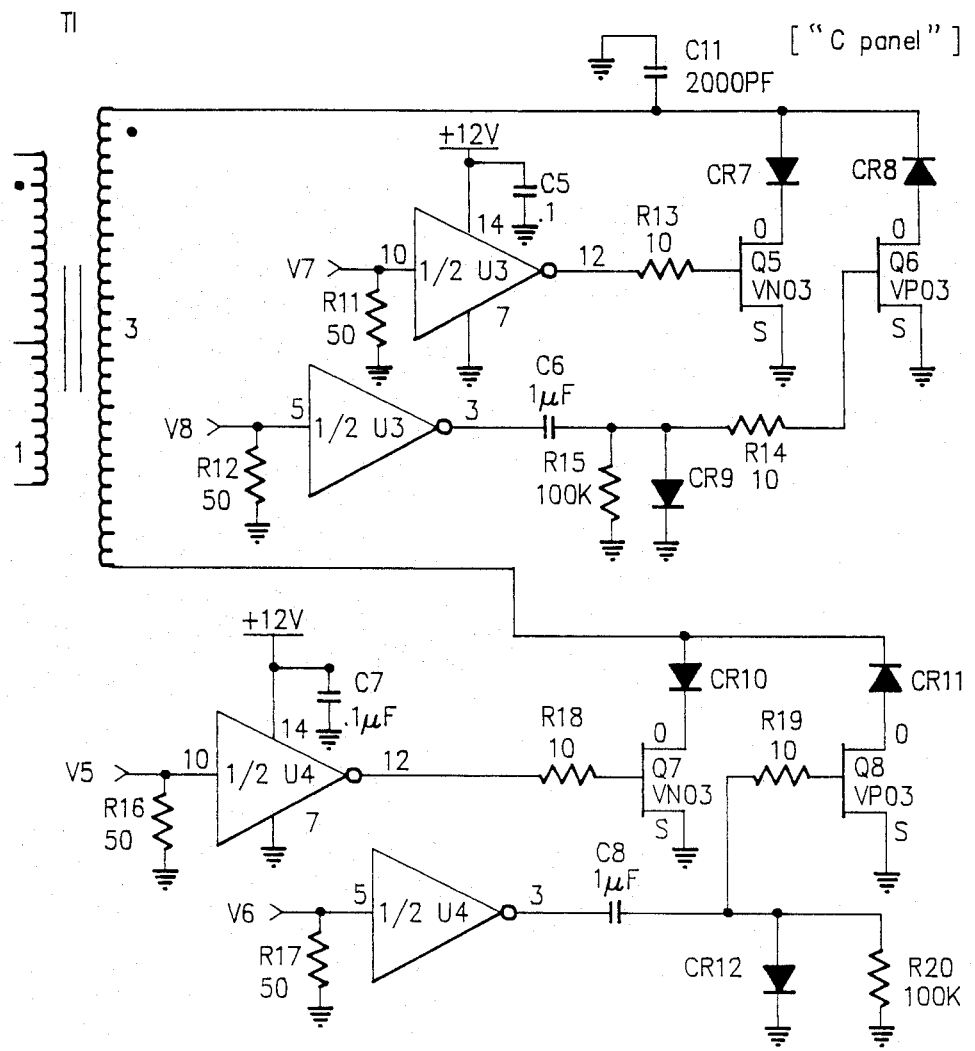
FIGS. 7, 7.1 and 7.2 are schematic, detailed diagrams of a further exemplary test embodiment of the row driver circuit of the general type of FIG. 6, including exemplary parts and circuit values.
Figure 7A:
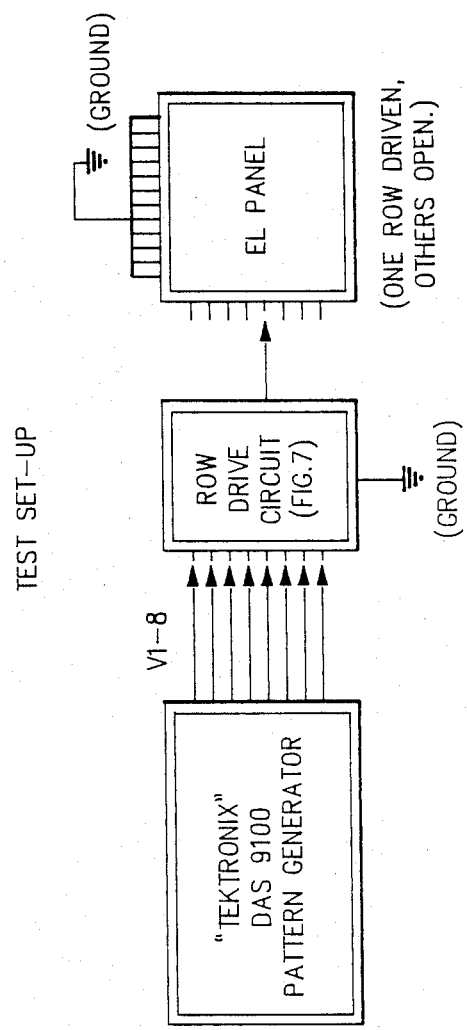
FIG. 7A is a block circuit diagram of a test setup using the circuit of FIG. 7 driving an exemplary row of an EL panel.

FIG. 7 is a schematic, detailed diagram of a test row drive circuit of the general type of FIG. 6, with the capacitive row electrode load $C_{panel}$ being simulated by a capacitor $C_{11}$, including exemplary detailed parts and circuit values. FIG. 7A is a generalized block circuit diagram of a test setup using the circuit of FIG. 7 to drive an exemplary row electrode of an EL panel. As illustrated, an exemplary "Tektronix" model DAS-9100 pattern generator can be used as a test signal generator, providing voltage signals $V_1$-$V_8$ to the row drive circuit for an exemplary row electrode of the EL panel. In the test setup all of the columns of the panel are grounded, with only one exemplary row being driven, while the other rows of the panel are "open."

Typically, most, if not all, of the circuit components of the circuits of FIGS. 4 & 6 would each be combined on a common printed circuit (PC) board $B_1$ & $B_2$, respectively.

Figure 8:
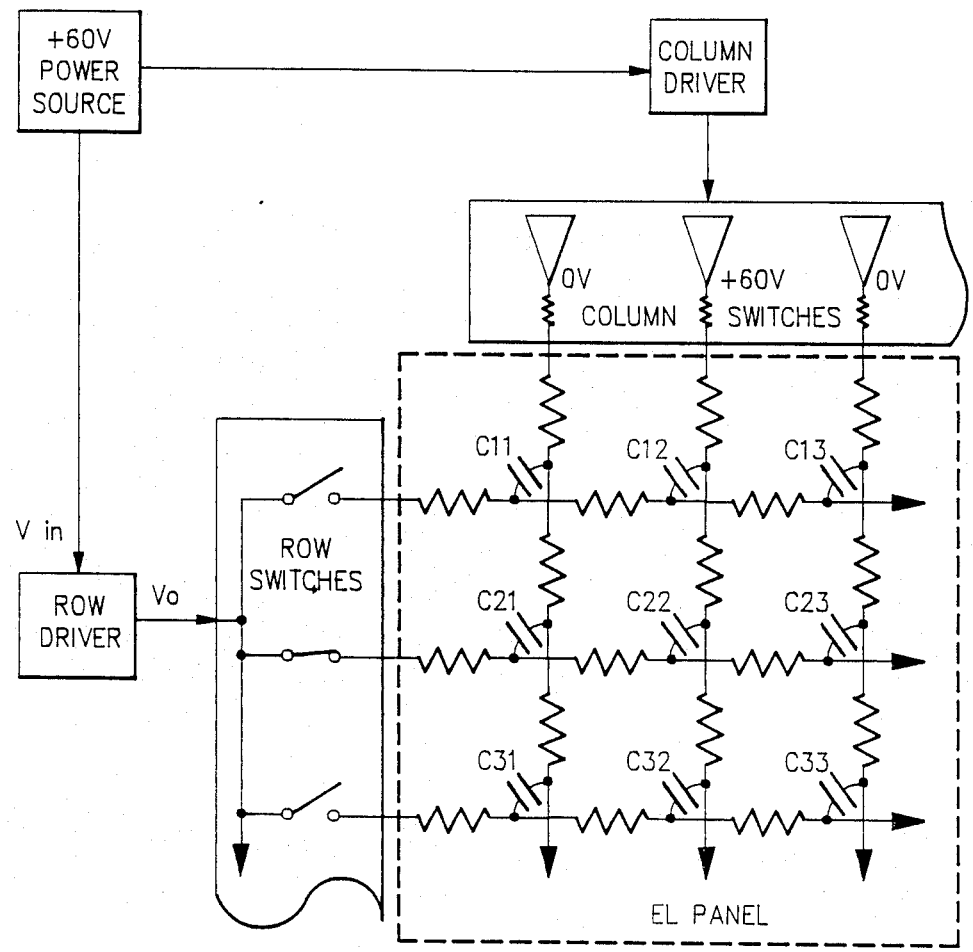
FIG. 8 is a generalized, block circuit diagram of an EL panel with its row and column drivers, with the two drivers being powered by the same power supply, in accordance with one aspect of the present invention.

As is standard in the art, the row drive wave form from, for example, the row drive circuit of FIG. 7, is switched and sequenced for each row by standard chip circuitry (not illustrated), which circuitry is not part of the present invention, but is generally illustrated in FIG. 8. Likewise appropriate driver and sequencing circuitry is used, such as, for example, one of the standard circuits of the prior art, for the panel columns, which circuitry is also not part of the present invention.

As should be understood from the foregoing, the driver circuit of the present invention, as described in detail with respect to, for example, either FIGS. 4 or 6, requires only one power source, which can be unregulated, if so desired. In fact, the row driver of the invention can use the same +60 V power source typically required in the EL column driver circuit, as generally illustrated in FIG. 8.

An exemplary listing of exemplary parts for the exemplary circuit of FIG. 7 is set out below:

| Circuit Element | Part/Value |
| --- | --- |
| U1, U2, U3, U4 | DS0026 |
| Q1, Q3 | 2N6798 |
| Q2, Q4 | IRFF9230 |
| Q5, Q7 | VN03 |
| Q6, Q8 | VP03 |
| CR1, CR2, CR4, CR5 | 1N5418 |
| CR3, CR6, CR9, CR12 | 1N4150 |
| C1, C3, C5, C7 | 0.1 MF (microfarad) |
| C2, C4, C6, C8 | 1 MF |
| C9 | 10 MF (12V) |
| C10 | 100 MF (28V) |
| C11 | 2,000 picoF (200V) |
| R1, R2, R6, R7, R11, R12, R16, R17 | 50 ohms |

| Circuit Element | Part/Value |
| --- | --- |
| CR7, CR8, CR10, CR11 | UES1105 |
| T1 | $L_p = 30$ milliHeneries winding ratio 1:3 |
| V1-V6 | BNC jacks |

As should be understood from the foregoing and the circuitry of FIGS. 4 & 6, the row drivers of the present invention will limit damage due to any inter-electrode shorts on the EL panel by limiting the energy transfer to each row. By limiting energy transfer to the row, IC component stresses are reduced to non-destructive levels, and the short on the EL panel will not have sufficient energy to destroy the electrode, which, if it would occur, would require panel replacement.

Additionally, it should be noted that the row drive circuit of this invention incorporates significant improvements in that all of the active switching elements are driven from ground potential, eliminating the need for floating switch drives Also, the voltage stress levels on many components are reduced through transformer coupling.

Although ground connections, as illustrated, are preferred, the components on the primary side could be connected to some other common primary voltage reference level, while those on the secondary could be connected to a common secondary voltage reference level. Likewise, although the diodes of the circuits are used as unidirectional current limiting devices in association with the switches, some switches inherently have unidirectional current limiting flow characteristics, and for those types of components, the diodes would not be necessary.

The circuit concepts described herein may be applied to alternating current (AC), thin film plasma panels, as well as to electroluminescent drive schemes.

Although this invention has been shown and described with respect to detailed, exemplary embodiments thereof, it should be understood by those skilled in the art that various changes in form, detail, methodology and/or approach may be made without departing from the spirit and scope of this invention.

Having thus described at least one exemplary embodiment of the invention, that which is new and desired to be secured by Letters Patent is claimed below.

We claim:

1. In an electrical display panel system, including-
   a display panel having row and column electrodes, said panel being capable of displaying indicia thereon in response to appropriate electrical signals to said row and column electrodes from a row driver and column driver, respectively;
   at least one electrical power source ($V_{in}$);
   a column driver connected to a power source and being capable of electrically driving said column electrodes; and
   an output load, including said row electrodes ($C_{panel}$) of said panel, which load is essentially capacitive;
   a row driver capable of electrically driving said row electrodes, said row driver being powered by said power source; and
   row switches causing the drive signals from said row driver to be sequentially pulsed to said row electrodes;
   the improvement in said row driver comprising:
   a transformer coupling (T1) being provided between the row driver power source and the capacitive row electrode panel load, said transformer coupling having a primary coil and a secondary coil;
   a first switch (S1 of FIG. 4; S1 or S3 of FIG. 6) with unidirectional current flow (D1 of FIG. 4; D1 or D3 of FIG. 6) being connected to one end of said primary coil and to a common primary voltage reference level, with said power source ($V_{in}$) being connected to a different end of said primary coil; said first switch when closed allowing said power source to provide a current flow through said primary coil, storing energy in it;
   a second switch (S2 of FIG. 4; S5 or S6 of FIG. 6) with unidirectional current flow (D2; D5 or D6) being connected to one end of said secondary coil and to a common secondary voltage reference level, with the row electrode load ($C_{panel}$) of the panel being connected across said secondary coil and said common secondary voltage reference level; the opening of said first switch causing the electrical energy in said primary coil to be provided to said capacitive row electrode load through said secondary coil, charging and driving said capacitive row electrode load; the closing of said second switch causing the transformer to be re-energized and the voltage across said capacitive row electrode load to at least approach said common secondary voltage reference level; the opening of said second switch allowing the energy restored in the transformer to be dumped back into said power source through said primary coil.

2. The improved row driver of claim 1, wherein both positive and negative voltage levels are to be applied to said capacitive row electrode load, and wherein said transformer includes an intermediate tap on the primary coil forming upper and lower primary coil legs, and wherein there is further included:
   a total of at least six switches (S1-S6 of FIG. 6), each of which has unidirectional current limiting flow allowing it to withstand a bi-directional voltage swing; said first switch (S1) being connected to the end of the upper leg of the intermediate-tap primary coil; a third switch (S2 of FIG. 6) of opposite polarity to said first switch being provided in parallel with said first switch; sixth and fourth switches (S3 & S4 respectively of FIG. 6) of opposite polarity connected in parallel between the lower leg end of said primary coil and said common primary voltage reference level; a fifth switch (S5 or S6) of opposite polarity to said second switch (S6 or S5, respectively) connected in parallel with said second switch; the upper leg of said primary coil being used to drive said capacitive row load to positive voltages and the lower leg of said primary coil being used to drive said capacitive row load to negative voltages.

3. The improved row driver of claim 2, wherein there is further included:
   seventh and eight switches (S7 & S8 of FIG. 6) of opposite polarity connected in parallel, forming further, residual energy dump switch means connected across said row electrode load and said common secondary voltage reference level; the closing of said switch means dissipating any remaining voltage charge on said capacitive row electrode load after it has re-energized said transformer.

4. The improved row driver of claim 2, wherein there is included a series of diodes connected in series with said switches, providing said unidirectional current flow for the switches.

5. The improved row driver of claim 1, wherein there is further included:
further, residual energy dump switch means ($S_3$ of FIG. 4; $S_7$ or $S_8$ of FIG. 6) connected across said row electrode load and said secondary voltage reference level; the closing of said residual energy dump switch means dissipating any remaining charge on said capacitive row electrode load.

6. The improved row driver of claim 1, wherein there is included only one power source powering both said row driver and said column driver.

7. The improved row driver of claim 1, wherein said panel is an electroluminescent (EL) panel.

8. The improved row driver of claim 1, wherein there is included a series of diodes connected in series with said switches, providing said unidirectional current flow for the switches.

9. The improved row driver of claim 1, wherein said primary and said secondary common voltage reference levels are ground, none of said switches being floating switches.

10. A method of improving the row driver for a electrical display panel system, which system includes-
a display panel having row and column electrodes, said panel being capable of displaying indicia thereon in response to appropriate electrical signals to said row and column electrodes from a row driver and column driver, respectively;
at least one electrical power source;
a column driver connected to a power source capable of electrically driving said column electrodes; and
an output load, including said row electrodes ($C_{panel}$) of said panel, which load is essentially capacitive;
a row driver capable of electrically driving said row electrodes, said row driver being powered by said power source; and
row switches causing the drive signals from said row driver to be sequentially pulsed to said row electrodes;
comprising the following step(s):
providing a transformer coupling between the row driver power source and the row electrode panel load, said transformer coupling having a primary coil and a secondary coil; and
providing-
a first switch ($S_1$ of FIG. 4; $S_1$ or $S_3$ of FIG. 6) with unidirectional current flow ($D_1$ of FIG. 4; $D_1$ or $D_3$ of FIG. 6) connected to one end of said primary coil and to a common primary voltage reference level, with said power source ($V_{in}$) connected to a different end of said primary coil;
closing said first switch, allowing said power source to provide a current flow through said primary coil, storing energy in it;
providing-
a second switch ($S_2$ of FIG. 4; $S_5$ or $S_6$ of FIG. 6) with unidirectional current flow ($D_2$; $D_5$ or $D_6$) connected to one end of said secondary coil and to a common secondary voltage reference level, with the row electrode load ($C_{panel}$) of the panel connected across said secondary coil and said common secondary voltage reference level;
opening said first switch, causing the electrical energy in said primary coil to be provided to said capacitive row electrode load through said secondary coil, charging and driving said capacitive row electrode load;
closing said second switch causing the transformer to be re-energized and the voltage across said capacitive row electrode load to at least approach said common secondary voltage reference level; and
opening said second switch, allowing the energy restored in the transformer to be dumped back into said power source through said primary coil.

11. The method of claim 10, wherein there is included the following step(s):
applying both positive and negative voltage levels to said capacitive row electrode load, and wherein said transformer includes an intermediate tap on the primary coil forming upper and lower primary coil legs, and wherein there is further included the step(s) of:
providing-
a total of at least six switches ($S_1$–$S_6$ of FIG. 6), each of which has unidirectional current limiting flow allowing it to withstand a bi-directional voltage swing; said first switch ($S_1$) connected to the end of the upper leg of the intermediate-tap primary coil; a third switch ($S_2$ of FIG. 6) of opposite polarity to said first switch being provided in parallel with said first switch; said and fourth switches ($S_3$ & $S_4$, respectively, of FIG. 6) of opposite polarity connected in parallel between the lower leg end of said primary coil and said common primary voltage reference level; a fifth switch ($S_5$ or $S_6$) of opposite polarity to said second switch ($S_6$ or $S_5$, respectively) connected in parallel with said second switch; and
using the upper leg of said primary coil to drive said capacitive row load to positive voltages and using the lower leg of said primary coil to drive said capacitive row load to negative voltages.

12. The method of claim 10, wherein there is included the following step(s):
transferring the charging energy to said row electrodes only through said transformer, limiting energy transfer to each row electrode to low levels, reducing integrated component stress to nondestructive levels in the event of an electrode short on the panel, preventing the destruction of the driver integrated circuits, which would otherwise cause the shorted electrode itself to burn out on the panel 13. The method of claim 10, wherein there is further included the following step(s):
driving all of the active switching elements from ground potential, eliminating the need for floating switch drives.

14. The method of claim 10, wherein there is further included the following step(s):
regulating peak voltages by using pulse width modulator techniques, allowing the use of an unregulated power source with the addition of feed forward control.

15. A method of improving the row driver for a electrical display panel system, which system includes-
a display panel having row and column electrodes, said panel being capable of displaying indicia thereon in response to appropriate electrical signals to said row and column electrodes from a row driver and column driver, respectively;
at least one electrical power source;

a column driver connected to a power source capable of electrically driving said column electrodes; and an output load, including said row electrodes ($C_{panel}$) of said panel, which load is essentially capacitive;

a row driver capable of electrically driving said row electrodes, said row driver being powered by said power source; and row switches causing the drive signals from said row driver to be sequentially pulsed to said row electrodes;

comprising the following step(s):

providing a transformer coupling between the row driver power source and the capacitive row electrode panel load, the charging, driving energy for said capacitive row electrode panel load being provided to it only through said transformer coupling, said transformer coupling having a primary coil and a secondary coil;

flowing current through the primary coil, storing electrical energy in said transformer;

using the secondary coil of the energized transformer to charge up the capacitive row electrode load, driving in sequence the row electrodes; and after driving a row electrode, using the charge on the capacitive row electrode load to re-energize the transformer; and dumping the energy in the re-energized transformer into the power supply; reducing the amount of energy consumption of said row driver and limiting the amount of driving energy supplied to the row electrode to that of the transformer.

16. The method of claim 15, wherein there is included the following step(s):

applying both positive and negative voltage levels to said capacitive row electrode load, and wherein said transformer includes an intermediate tap on the primary coil forming upper and lower primary coil legs, and wherein there is further included the step(s) of:

using the upper leg of said primary coil to drive said capacitive row load to positive voltages and using the lower leg of said primary coil to drive said capacitive row load to negative voltages.

* * * * *

UNITED STATES PATENT AND TRADEMARK OFFICE
CERTIFICATE OF CORRECTION

PATENT NO. : 4,954,752

DATED : September 4, 1990

INVENTOR(S) : Edward L. Young, Mohan L. Kapoor

It is certified that error appears in the above-identified patent and that said Letters Patent is hereby corrected as shown below:

Column 10, Claim 11, line 27, after "switch;" insert -- sixth --.

Column 10, claim 11, line 27, "said" should be deleted.

Signed and Sealed this

Eleventh Day of February, 1992

Attest:

HARRY F. MANBECK, JR.

*Attesting Officer*   *Commissioner of Patents and Trademarks*